United States Patent [19]

Buhl

[11] 4,275,144
[45] Jun. 23, 1981

[54] METHOD OF FABRICATING ELECTRODES WITH NARROW GAP THEREBETWEEN

[75] Inventor: Lawrence L. Buhl, New Monmouth, N.J.

[73] Assignee: Bell Telephone Laboratories, Incorporated, Murray Hill, N.J.

[21] Appl. No.: 114,833

[22] Filed: Jan. 24, 1980

[51] Int. Cl.³ .............................................. B05D 3/06
[52] U.S. Cl. ................................. 430/312; 427/54.1; 427/43.1
[58] Field of Search ...................... 427/43.1, 265, 54.1; 430/312, 315

[56] References Cited

U.S. PATENT DOCUMENTS 4,155,627  5/1979  Gale et al. ............................ 427/43.1

Primary Examiner—John H. Newsome
Attorney, Agent, or Firm—Sylvan Sherman

[57] ABSTRACT

High speed, integrated optical directional coupler modulators utilize spaces of the order of one micron between waveguides. While one micron delineation of the waveguides can be readily obtained using conformable mask exposure techniques, diffraction effects become significant using thick glass masks required to delineate the electrodes. To overcome this problem, a two-process electrode fabrication procedure is employed. In accordance with the procedure a first pair of electrodes are deposited by a lithographic process. However, this yields a gap between electrodes that is wider than the desired gap. To reduce this distance, the process is repeated with the gap forming region of the mask laterally displaced. The result yields an electrode pattern with the desired spacing and thickness.

2 Claims, 8 Drawing Figures

METHOD OF FABRICATING ELECTRODES WITH NARROW GAP THEREBETWEEN

TECHNICAL FIELD

This invention relates to a method for forming closely spaced electrodes.

BACKGROUND OF THE INVENTION

An integrated optical directional coupler, formed by two parallel strip waveguides, can be used as a modulator by electrically switching the coupler between its crossover state and its through state. One way of doing this is to fabricate the coupler on an electrooptic material and apply a switching voltage which induces a mismatch ($\Delta\beta$) via the electrooptic effect. The rate at which the modulator can be switched depends primarily upon the capacitance of the electrodes used to apply the electric field. At present, switching rates in excess of 5 GHz have been achieved with very small devices employing waveguide and electrode spacings of about one micron.

While it is relatively easy to obtain waveguide spacings of one micron by using conformable mask exposure techniques wherein very close contact is maintained between the mask and the underlying substrate (i.e., separations of less than 1000 Å), it has been much more difficult to achieve comparable spacing between electrodes using relatively thick glass masks. Particularly so, when the wavelength of the illuminating radiation is comparable to both the mask aperture and to the distance between the mask and the underlying substrate surface. Under these conditions, diffraction effects tend to limit the obtainable resolution.

SUMMARY OF THE INVENTION

The present invention relates to a two-process method of fabricating electrodes by lithographic means. The method includes the steps of: covering the substrate surface with a first layer of resist material; exposing said material to radiant energy through a mask having a gap defining region whose width is of the same order of magnitude as the wavelength of the radiant energy; developing said exposed resist material and depositing a first metal layer upon the exposed substrate surface; covering said metallized substrate once again with a second layer of resist material; positioning said mask such that the gap forming region is laterally displaced so as to extend over at least a portion of said first metal layer; exposing said second layer to said radiant energy through said mask; developing said exposed material and depositing a second metal layer upon said pattern delineated surface.

It is an advantage of the two-process method that smaller gaps can be obtained than are otherwise obtainable by conventional means. It is a further advantage of the invention that thicker electrodes, having correspondingly lower resistance, can be readily fabricated.

DETAILED DESCRIPTION

FIGS. 1-8 illustrate the steps in the fabrication of closely spaced electrodes by means of lithography using a conventional mask alignment machine. For purposes of illustration and explanation, reference is made to a one micron gap between electrodes. However, the process is in no way limited to one micron or any other specific dimension. It should also be noted that the electrodes would typically be aligned with underlying optical waveguides. However, for purposes of explanation, these have been omitted.

Figure 1:
FIGS. 1-8 illustrate the several stages in the fabrication of closely spaced electrodes in accordance with the invention.

As indicated hereinabove, the method, in accordance with the present invention, is a two-process method where the second process is basically a repeat of the first in which the mask is laterally displaced. More specifically, FIG. 1 shows a substrate 10 (upon which the electrodes are to be deposited) which has been coated with a suitable resist material 11. In practice, a positive resist material is advantageously employed.

Figure 2:
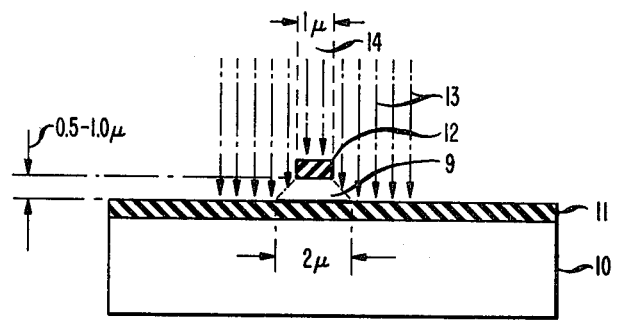
Figure 3:
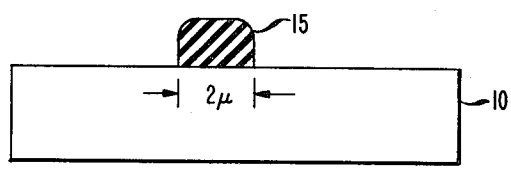
Figure 4:
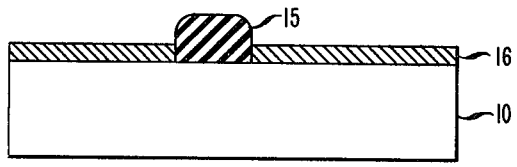
Figure 5:
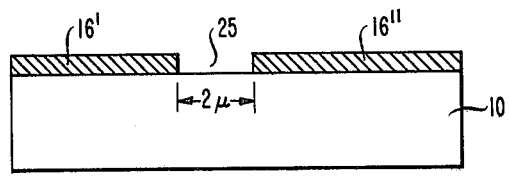

FIG. 2 shows the resist-coated substrate and a mask 12, positioned above the substrate. The mask, which comprises an opaque, gap defining region 14, is positioned a distance away from the substrate. The mask gap region, in this illustrative embodiment, is one micron wide and the space between the mask and the resist layer is between 0.5 and 1 micron. Spacing the mask away from the substrate minimizes contact and eliminates most of the defects that result from contact. (See, "Pathways in Device Lithography" by E. I. Gordon and D. R. Herriott, published in the *IEEE Transactions on Electron Devices*, Vol. ED-22, No. 7, July 1975, pp. 371-375.) However, diffraction of the exposing radiation causes a reduction in resolution. As shown in FIG. 2, diffraction of the incident radiation 13, at an operating wavelength of 0.3-0.325$\mu$, causes a 2$\mu$ portion 9 of the resist layer under the mask to be in shadow. Thus, after developing, a 2$\mu$ strip 15 of developed resist material remains, as shown in FIG. 3. The height of strip 15 has been exaggerated to illustrate its shape more clearly. Typically, the strip will have fairly vertical sides at the lower end, and a curved upper portion. This is important as it serves to limit the height of the useful metal layer that can be deposited. Advantageously, the metal layer 16 subsequently deposited is, as shown in FIG. 4, confined to a height that corresponds to the vertical lower portion of strip 15. After metalization, the developed resist is dissolved leaving a pair of electrodes 16'-16", as shown in FIG. 5, separated by 2$\mu$ gap 25, rather than the desired one micron spacing.

Figure 6:
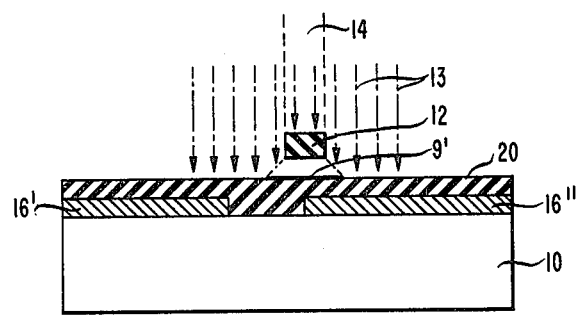

To obtain the desired spacing, the process is repeated. The metallized substrate is covered with a second positive resist layer, exposed through the same mask, and developed. However, as noted above, the mask is displaced laterally, as illustrated in FIG. 6 which shows the second resist layer 20 disposed over electrodes 16'-16", and the resulting 2$\mu$ shaded region 9' on resist 20. The mask, it will be noted, is laterally displaced to the right such that the gap defining region 14 is parallel to the gap between the electrodes and extends over at least a portion of electrode 16". The precise amount of displacement will depend upon the extent of the diffraction that results, and is a function of the air space between the mask and substrate, the width of the mask, and the wavelength of the exposing radiation 13.

Figure 7:
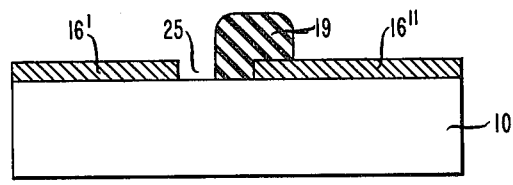

After exposure and developing, the resist pattern 19, illustrated in FIG. 7, is obtained. As can be seen, the pattern is displaced and covers only a portion of the previously formed gap 25 between electrodes 16' and 16".

Figure 8:
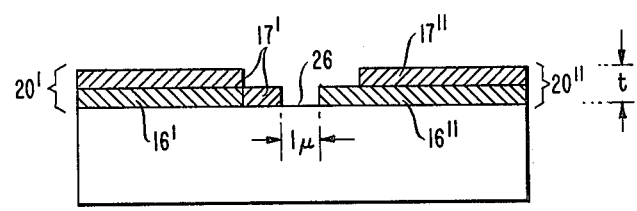

A second metallic layer is then deposited, and the resist dissolved, leaving the final electrode configuration 20'-20" comprising the first pair of metal layers 16' and 16" over which there is deposited a second pair of metal layers 17' and 17", as shown in FIG. 8. As can be seen, the resulting gap 26 has been reduced. In addition, the thickness t, of the bulk of the electrodes is twice what it would otherwise be with a single deposition, thus significantly reducing the resistance of the electrodes.

One micron spaced electrodes were fabricated in the manner described hereinabove using a Model 2100 Kasper mask aligner and a mask having a one micron gap defining region. As is apparent, masks having larger gap defining regions can also be used. The disadvantage in doing so resides in fact that as the mask size is increased, the area of the electrodes having only a single thickness is correspondingly increased. This, in turn, increases the resistance of the electrodes and the power required to drive them.

I claim:

1. A method of fabricating closely spaced electrodes by lithographic means comprising the steps of:

covering a surface of a substrate (10) upon which said electrodes are to be deposited with a first layer (11) of resist material;

exposing said material to radiant energy (13) through a mask (12) that is spaced away from the surface of said first resist layer (11) a distance that is of the same order of magnitude as the wavelength of said radiant energy and has a gap defining region (14) whose width is of the same order of magnitude as the wavelength of said radiant energy;

developing said exposed resist material to form a pattern of developed resist (15) upon said surface;

depositing a first metal layer on said pattern delineated surface;

removing said developed resist (15) leaving a pair of electrodes (16', 16") separated by a first gap 25;

covering said metallized substrate surface with a second layer (20) of resist material;

placing said mask (12) a distance above the surface of said second resist layer (20) that is of the same order of magnitude as the wavelength of said radiant energy and positioning said mask (12) such that said gap defining region (14) is aligned parallel to the gap between said electrodes and extends over at least a portion of one of said electrodes (16");

exposing said second layer of material to said radiant energy through said mask;

developing said exposed resist material to form a second pattern of developed resist material (19);

depositing a second metal layer (17'-17") over said pattern delineated surface; and removing said developed resist (19) leaving a pair of electrodes (20'-20") separated by a second gap 26 that is smaller than said first gap 25.

2. A method according to claim 1 wherein said resist is a positive resist.

* * * * *